US007646023B2

(12) United States Patent
Park et al.

(10) Patent No.: US 7,646,023 B2
(45) Date of Patent: Jan. 12, 2010

(54) TFT ARRAY PANEL, LIQUID CRYSTAL DISPLAY INCLUDING SAME, AND METHOD OF MANUFACTURING TFT ARRAY PANEL

(75) Inventors: Yong-han Park, Anyang-si (KR); Jin Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 324 days.

(21) Appl. No.: 11/416,934

(22) Filed: May 2, 2006

(65) Prior Publication Data
US 2006/0243979 A1 Nov. 2, 2006

(30) Foreign Application Priority Data
May 2, 2005 (KR) .................. 10-2005-0036798

(51) Int. Cl.
*H01L 29/04* (2006.01)
(52) U.S. Cl. .................. 257/72; 257/59; 257/E27.11; 257/E29.282; 349/43; 438/157
(58) Field of Classification Search .................. 257/59, 257/72; 349/43; 438/157
See application file for complete search history.

(56) References Cited

U.S. PATENT DOCUMENTS

| 2003/0081159 A1* | 5/2003 | Ha et al. ............... 349/113 |
| 2003/0202132 A1* | 10/2003 | Park ...................... 349/43 |
| 2003/0232456 A1* | 12/2003 | Yang et al. ............. 438/30 |
| 2004/0246409 A1* | 12/2004 | Jeon et al. ............. 349/110 |
| 2005/0174503 A1* | 8/2005 | Kim et al. .............. 349/46 |

FOREIGN PATENT DOCUMENTS

| JP | 5-196950 | * | 8/1993 |
| JP | 9-329808 | | 12/1997 |
| JP | 2000-122093 | | 4/2000 |
| JP | 2002-250913 | | 9/2002 |

OTHER PUBLICATIONS

Patent Abstracts of Japan, Publication No. 9-329808, Dec. 22, 1997, 1 p.
Patent Abstracts of Japan, Publication No. 2000-122093, Apr. 28, 2000, 1 p.
Patent Abstracts of Japan, Publication No. 2002-250913, Sep. 6, 2002, 1 p.

* cited by examiner

*Primary Examiner*—A. Sefer
(74) *Attorney, Agent, or Firm*—Innovation Counsel LLP

(57) ABSTRACT

A thin film transistor (TFT) array panel effectively minimizing light leakage current and a liquid crystal display including the same. The panel includes a transistor structure having a gate electrode formed on an insulating substrate; a semiconductor layer formed on and insulated from the gate electrode; a light blocking layer formed around and overlapping a portion of the gate electrode; a data line intersecting the gate line to form a source electrode, which overlaps a portion of the semiconductor layer; a drain electrode opposing to the source electrode and overlapping a portion of the semiconductor layer, and a pixel electrode formed on and insulated from the transistor structure and electrically connected to the drain electrode.

59 Claims, 6 Drawing Sheets

TFT ARRAY PANEL, LIQUID CRYSTAL DISPLAY INCLUDING SAME, AND METHOD OF MANUFACTURING TFT ARRAY PANEL

BACKGROUND OF THE INVENTION

This application claims priority from Korean Patent Application No. 10-2005-0036798, filed on May 2, 2005, in the Korean Intellectual Property Office, the disclosure of which is incorporated herein in its entirety by reference.

1. Field of the Invention

The present invention relates to a thin film transistor (TFT) array panel and a liquid crystal display including the same, and a manufacturing method of the TFT array panel. More particularly, the present invention relates to a TFT array panel that can prevent the occurrence of light leakage current in a channel region, a liquid crystal display including the same, and a manufacturing method of the TFT array panel.

2. Description of the Related Art

A liquid crystal display includes a color filter panel including a color filter and a thin film transistor (TFT) array panel including a TFT array. The color filter panel and the TFT array panel face with each other and are assembled with a seal line interposed therebetween. A liquid crystal layer is formed at an air gap defined between the color filter panel and the TFT array panel. That is, a liquid crystal display includes two panels (color filter panel and TFT array panel) including electrodes and a liquid crystal layer interposed between the two panels. When a voltage is applied to the electrodes, a liquid crystal display produces an image by adjusting the amount of light transmitted therethrough through the rearrangement of liquid crystal molecules of a liquid crystal layer. Since a liquid crystal display is a non-emissive device, a backlight unit can be positioned behind the TFT array panel as a light source. The transmittance of light emitted from the backlight is adjusted by controlling the orientation of liquid crystals.

Each pixel of a TFT array panel includes a switching device. The switching device is a three-terminal device including a control terminal connected to a gate line, an input terminal connected to a data line, and an output terminal connected to a pixel electrode.

In a liquid crystal display using such a switching device, light leakage current may occur, when light is incident in a channel region of the switching device, thereby decreasing a contrast ratio or causing poor display quality such as image flickering. The light leakage current may be caused by external light, or by light emitted from the backlight of the liquid crystal display.

SUMMARY

The present invention provides embodiments of a thin film transistor (TFT) array panel capable of preventing light leakage current.

The present invention also provides embodiments of a liquid crystal display including the TFT array panel.

The present invention further provides embodiments of a manufacturing method of the TFT array panel.

In accordance with aspects of the present invention, a TFT array panel is provided, including: a transistor structure having a gate line and a data line intersecting the gate line, which structure includes a gate electrode formed on an insulating substrate from the gate line; a semiconductor layer formed on and insulated from the gate electrode; a light blocking layer formed around and overlapping at least a portion of the gate electrode; a source electrode formed from the data line and overlapping at least a portion of the semiconductor layer; a drain electrode opposing to the source electrode with respect to the gate electrode and overlapping at least a portion of the semiconductor layer; and the TFT array panel including a pixel electrode formed on and insulated from the transistor structure and electrically connected to the drain electrode.

According to another aspect of the present invention, a liquid crystal display is provided including a TFT array panel comprising a gate electrode formed on an insulating substrate; a semiconductor layer formed on, insulated from, and completely overlapping the gate electrode; a light blocking layer formed on the same layer as the semiconductor layer and overlapping at least a portion of the gate electrode along an edge of the gate electrode; a source electrode overlapping at least a portion of the semiconductor layer; a drain electrode opposing to the source electrode with respect to the gate electrode and overlapping at least a portion of the semiconductor layer, wherein a transistor structure is formed from the gate electrode, semiconductor layer, light blocking layer, the source electrode, and the drain electrode; and a pixel electrode formed on and insulated from the transistor structure and electrically connected to the drain electrode, and a color filter panel comprising a color filter and a common electrode, the color filter panel formed opposite to and facing the TFT array panel on the insulating substrate.

According to additional aspects of the present invention, a method of manufacturing of a TFT array panel is provided, including: forming a gate line on an insulating substrate, the gate line comprising a gate electrode; forming a semiconductor layer on and insulated from the gate electrode; forming a light blocking layer around and overlapping at least a portion of the gate electrode; forming a data line intersecting the gate line, wherein the data line comprises a source electrode, wherein the source electrode is formed to overlap at least a portion of the semiconductor layer; forming a drain electrode opposing to the source electrode with respect to the gate electrode wherein the drain electrode is formed to overlap at least a portion of the semiconductor layer; wherein a transistor structure is formed from the gate electrode, the semiconductor layer, the light blocking layer, the source electrode, and the drain electrode, and forming a pixel electrode on and insulated from the transistor structure and electrically connected to the drain electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
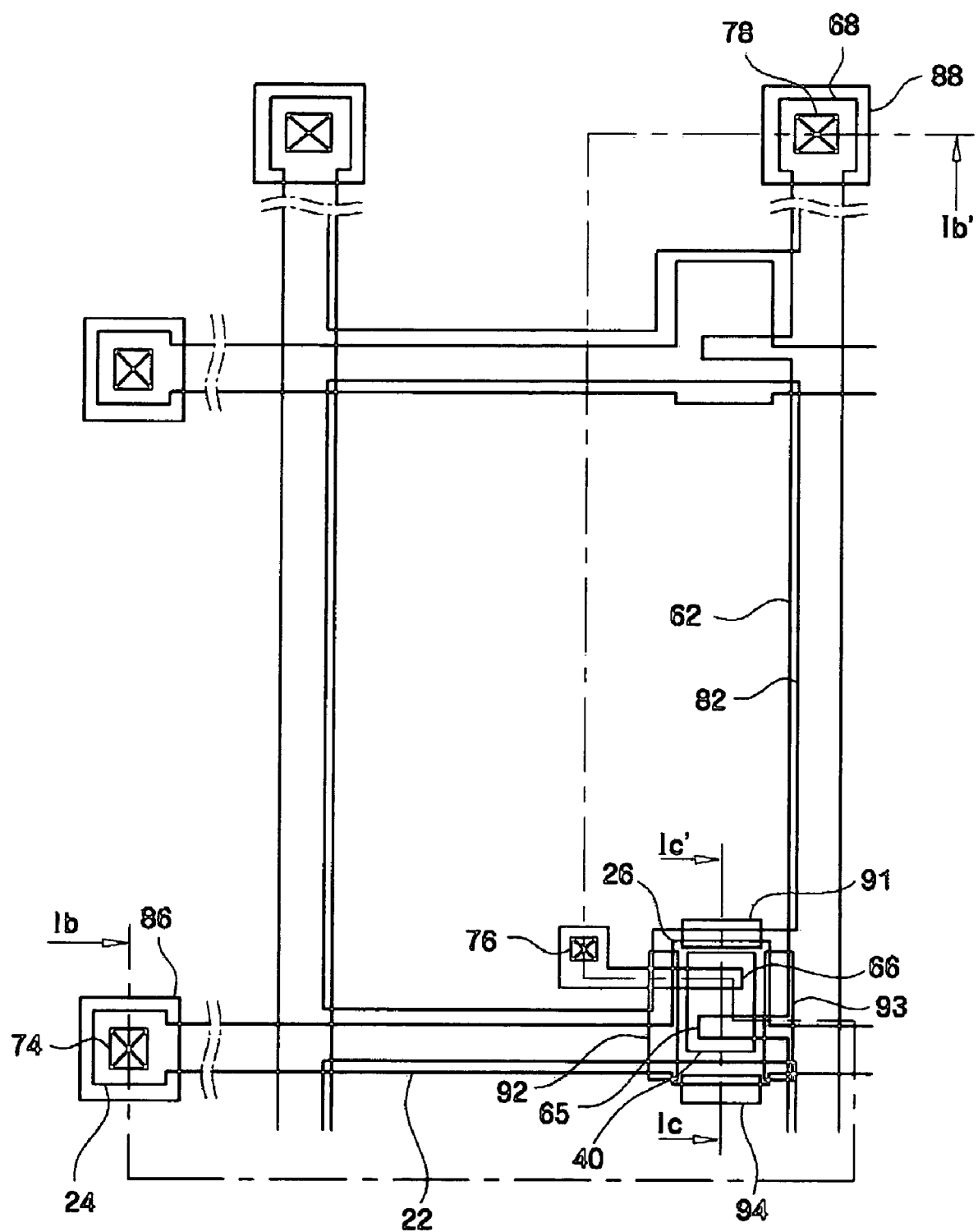
FIG. 1A is a circuit view of a thin film transistor (TFT) array panel according to an embodiment of the present invention.

Throughout the specification, like reference numerals refer to like elements.

Figure 1B:
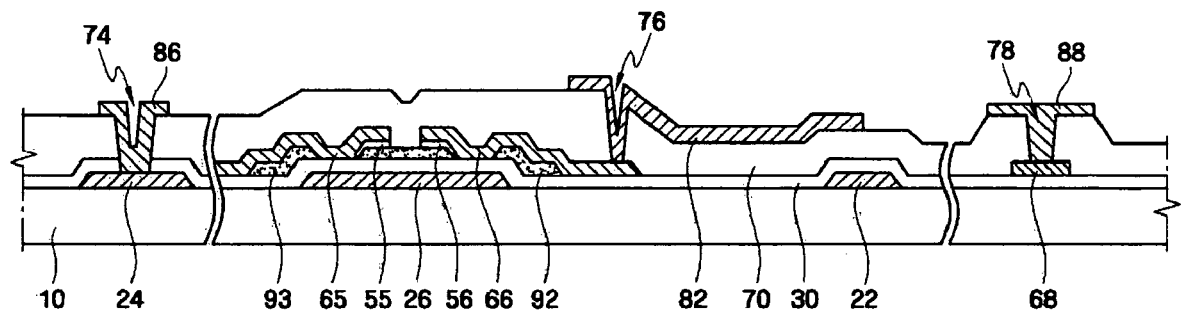
FIG. 1B is a sectional view taken along line Ib-Ib' of the TFT array panel of FIG. 1A.
Figure 1C:
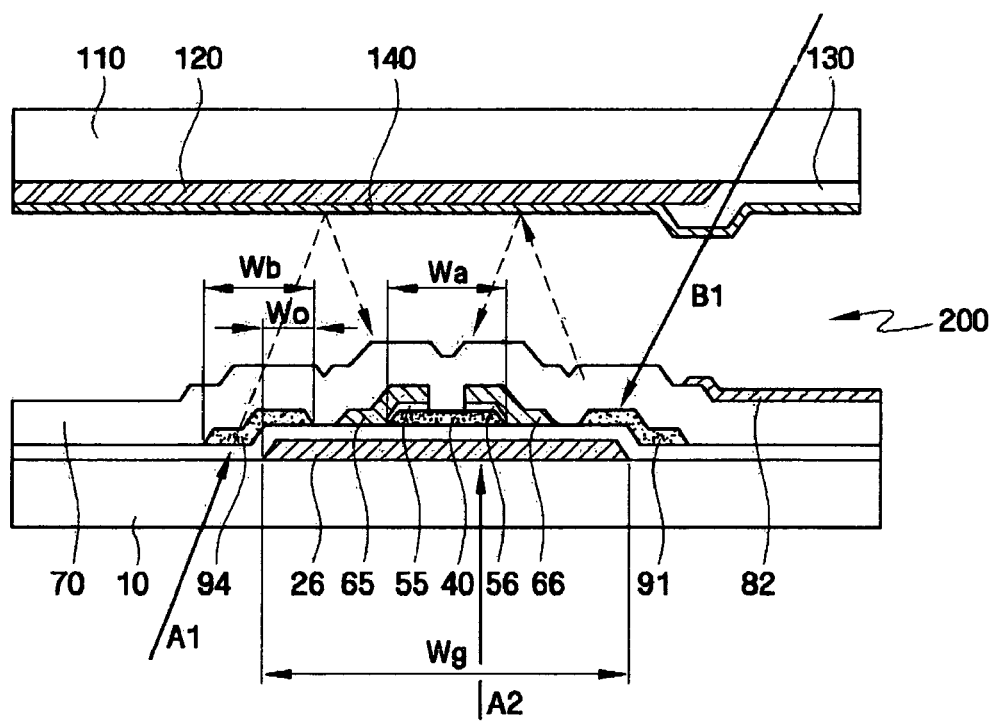
FIG. 1C is a sectional view taken along line Ic-Ic' of the TFT array panel of FIG. 1A and having a color filter panel disposed thereon, illustrating a liquid crystal display, according to an embodiment of the present invention.

A thin film transistor (TFT) array panel for a liquid crystal display (LCD) according to an embodiment of the present invention will now be described with reference to FIGS. 1A through 1C. FIG. 1A is a circuit view of a thin film transistor (TFT) array panel according to an embodiment of the present invention, FIG. 1B is a sectional view taken along a line Ib-Ib' of FIG. 1A, and FIG. 1C is a sectional view taken along a line Ic-Ic' of FIG. 1A, illustrating a liquid crystal display in which a color filter panel is disposed on a TFT array panel. A TFT array panel for a liquid crystal display according to an embodiment of the present invention will first be described with reference to FIGS. 1A and 1B. Then, a liquid crystal display including the TFT array panel will be described with reference to FIG. 1C.

Referring to FIGS. 1A and 1B, gate lines 22, 24, and 26 are formed on insulating substrate 10. Here, gate lines 22, 24, and 26 may be made of conductive metals, including without limitation, an aluminum (Al)-based metal, including aluminum and an aluminum alloy; a silver (Ag)-based metal, including silver and a silver alloy; a copper (Cu)-based metal, including copper and a copper alloy; a molybdenum (Mo)-based metal, including molybdenum and a molybdenum alloy; as well as conductive metals including, without limitation, chromium (Cr), titanium (Ti), or tantalum (Ta). The gate lines 22, 24, and 26 may have a multi-layer structure formed from two conductive layers (not shown) having different physical properties. One of the two conductive layers may be made of a low resistivity metal, e.g., an aluminum-based metal, a silver-based metal, or a copper-based metal, to reduce signal delay or voltage drop of the gate lines 22, 24, and 26. The other conductive layer may be made of a material possessing excellent contact characteristics with ITO (indium tin oxide) and IZO (indium zinc oxide), e.g., a molybdenum-based metal, chromium, titanium, or tantalum. For example, the gate lines 22, 24, and 26 may have a composite structure including, for example, a lower chromium layer and an upper aluminum layer, or a lower aluminum layer and an upper molybdenum layer. However, the present invention is not limited to the above-illustrated examples. That is, the gate lines 22, 24, and 26 may be made of any suitably conductive materials.

The gate lines 22, 24, and 26 includes a gate line 22 extending in a row direction; a gate line terminal 24, connected to an end of the gate line 22, receiving a gate signal from the outside and transmitting the received gate signal to the gate line 22; and a gate electrode 26 connected to the gate line 22. The gate line 22 mainly extending in a row direction transmits a gate signal to pixels. The gate line terminal 24 may have a large area suitable for connecting to an external circuit. The gate lines 22, 24, and 26 are covered with gate insulating layer 30 made of silicon nitride (SiNx), or similar insulating material. An island-shaped semiconductor layer 40 made of a semiconductor, such as hydrogenated amorphous silicon or polycrystalline silicon, is formed on gate insulating layer 30 of gate electrode 26. Semiconductor layer 40 may completely overlap with gate electrode 26 to prevent the direct incidence of light emitted into semiconductor layer 40 from a backlight disposed at the back of a TFT array panel. The shape of semiconductor layer 40 may be diversely changed.

A light blocking layer also is formed on gate insulating layer 30 to be positioned on the same layer as semiconductor layer 40. After light emitted from a backlight is incident around gate electrode 26 at a predetermined incidence angle, it may be reflected from a common electrode (not shown) of a color filter panel (not shown) and then incident into semiconductor layer 40. The light blocking layer serves to prevent the light incidence into semiconductor layer 40. Thus, the light blocking layer may overlap with at least a portion of gate electrode 26 along the edge of gate electrode 26. When the light blocking layer overlaps with gate electrode 26 along the edge of gate electrode 26, light passed through the periphery of gate electrode 26 at a predetermined incidence angle can be efficiently prevented from being incident into semiconductor layer 40. It is desirable that the overlapping area between the light blocking layer and gate electrode 26 be small enough to minimize the parasitic capacitance. In this respect, the light blocking layer is aligned along the edge of gate electrode 26 to minimize the parasitic capacitance. However, when a process margin is considered, an overlapping width between the light blocking layer and gate electrode 26 may be about 3 μm or less. The light blocking layer may be made of a material capable of efficiently absorbing light. For example, the light blocking layer may be made of substantially the same material as semiconductor layer 40.

In this embodiment, the light blocking layer may be composed of a plurality of light blocking sub-layers which are isolated from each other. Here, the light blocking sub-layers include first light blocking layer 91, second light blocking layer 92, third light blocking layer 93, and fourth light blocking layer 94, which are respectively positioned at upper, left, right and lower sides of gate electrode 26. Light blocking sub-layers 91, 92, 93, and 94 are formed in island shapes and isolated from each other. This embodiment has been illustrated in terms of the four light blocking sub-layers 91, 92, 93, and 94 to prevent the occurrence of light leakage current, however the present invention is not limited thereto. Provided that light leakage current can be effectively prevented, one or more of light blocking sub-layers 91, 92, 93, and 94 may be used. However, when light blocking sub-layers 91, 92, 93, and 94 are conductive, they may be disposed to avoid a short between a source electrode 65 and a drain electrode 66. That is, light blocking sub-layers 91, 92, 93, and 94 may overlap with either source electrode 65 or drain electrode 66. It is desirable that first and fourth light blocking sub-layers 91 and 94 do not overlap with source electrode 65 and drain electrode 66, in order to efficiently transmit a data signal to pixels. The shapes of light blocking sub-layers 91, 92, 93, and 94 are not limited to the above-illustrated examples, and may be diversely changed.

Ohmic contact layers 55 and 56 are formed together in a pair on semiconductor layer 40 and may be made of silicide or n+-hydrogenated amorphous silicon, doped with high concentration n-type impurity. Data lines 62, 65, 66, and 68 are formed on ohmic contact layers 55 and 56 and gate insulating layer 30. Data lines 62, 65, 66, and 68 include data line 62 extending in a column direction and intersecting gate line 22 to define pixels; source electrode 65 connected to data line 62 and extending over ohmic contact layer 55; a data line terminal 68 connected to an end of data line 62 and receiving an image signal from the outside; and drain electrode 66 separated from source electrode 65 and formed on ohmic contact layer 56 to be opposite to source electrode 65 with respect to gate electrode 26. Data line terminal 68, which is an end of data line 62 may be formed sufficiently wide to be connected to an external circuit. Data lines 62, 65, 66, and 68 may be made of a refractory metal, for example, without limitation, chromium, molybdenum-based metal, tantalum, titanium. Data lines 62, 65, 66, and 68 may have a multi-layer structure composed of a lower layer (not shown) of refractory metal and an upper layer (not shown) of low resistance material formed on the lower layer. For example, data lines 62, 65, 66, and 68 may have a bi-layer structure composed of a lower chromium layer and an upper aluminum layer, or a lower aluminum layer and an upper molybdenum layer as described above, or a tri-layer structure composed of a molybdenum layer, an aluminum layer, and a molybdenum layer. Source electrode 65 overlaps with at least a portion of semiconductor layer 40. Drain electrode 66 is opposing to source electrode 65 with respect to gate electrode 26, and overlaps with at least a portion of semiconductor layer 40. Ohmic contact layers 55 and 56 are interposed between underlying semiconductor layer 40, and overlying source and drain electrodes 65 and 66 to reduce a contact resistance. The light blocking sub-layers 91, 92, 93, and 94 may overlap with source electrode 65 or drain electrode 66. However, it is desirable that overlapping areas between light blocking sub-layers 91, 92, 93, and 94 and source electrode 65 or drain electrode 66 are small enough to efficiently transmit a data signal applied to data lines 62, 65, 66, and 68 and to reduce a parasitic capacitance. That is, first light blocking layer 91 and fourth light blocking layer 94 may not overlap with source electrode 65 and drain electrode 66, whereas second light blocking layer 92 and third light blocking layer 93 may overlap with drain electrode 66 and source electrode 65, respectively. Although simultaneous overlapping of each light blocking layer with source electrode 65 and drain electrode 66 may not be desirable, each light blocking layer may overlap with a predetermined portion of source electrode 65 or drain electrode 66.

Passivation layer 70 is formed on data lines 62, 65, 66, and 68, and an exposed portion of semiconductor layer 40 therethrough. Passivation layer 70 may be an inorganic layer made of silicon nitride (SiNx) or silicon oxide, a low dielectric chemical vapor deposition (CVD) layer such as an a-Si:C:O or a-Si:O:F layer deposited by plasma enhanced CVD (PECVD), or an acrylic organic insulating layer having excellent planarization characteristics and photosensitivity. The low dielectric CVD layer such as a-Si:C:O or a-Si:O:F layer deposited by PECVD typically has very low dielectric constant, i.e., about 4 or less, and desirably between about 2 to about 4. Therefore, parasitic capacitance can be minimized, even when the low dielectric CVD layer is formed as a thin layer. Furthermore, the low dielectric CVD layer may exhibit excellent adhesion along with another layer and step coverage. Moreover, because the low dielectric CVD layer is an inorganic CVD layer, it tends to exhibit excellent heat resistance, relative to an organic insulating layer. In addition, the deposition rate and etching rate of the low dielectric CVD layer may be about 4 to about 10 times faster than those of a silicon nitride layer, and thus, processing time may be significantly reduced. Passivation layer 70 may have a bi-layer structure composed of a lower inorganic layer and an upper organic layer, for example, to protect an exposed portion of semiconductor layer 40 while maintaining desirable characteristics of an organic layer. Contact holes 76 and 78 are formed in passivation layer 70 to expose drain electrode 66 and data line terminal 68, respectively. Passivation layer 70, together with gate insulating layer 30, is formed with contact hole 74 to expose gate line terminal 24. At this time, contact holes 74 and 78 may be formed, thereby exposing gate line terminal 24 and data line terminal 68. Holes 74 and 78 can be provided in various shapes, such as square or circle. The width of contact holes 74 and 78 may be enlarged to be connected to an external circuit. Pixel electrode 82 is formed on passivation layer 70 in such a way to be electrically connected to drain electrode 66 via contact hole 76 and positioned in a pixel area. Furthermore, auxiliary gate line terminal 86 and auxiliary data line terminal 88 are formed on passivation layer 70 to connect to gate line terminal 24 and data line terminal 68 via contact holes 74 and 78, respectively. Here, pixel electrode 82, and auxiliary gate and data line terminals 86 and 88, may be made, for example, of a transparent conductor such as ITO or IZO, or of a reflective conductor such as aluminum.

As shown in FIGS. 1A and 1B, pixel electrode 82 may form a sustain capacitor by overlapping gate line 22. When sustain capacitance is insufficient, an additional line for sustain capacitance may be formed on the same layer as gate lines 22, 24, and 26. Pixel electrode 82 also may overlap with data line 62 to maximize the aperture ratio of a pixel. Even when pixel electrode 82 overlaps with data line 62 to maximize the aperture ratio of a pixel, the parasitic capacitance formed between pixel electrode 82 and data line 62 can be sufficiently reduced due to the low dielectric constant of passivation layer 70. To improve lateral visibility, pixel electrode 82 may include a plurality of cutouts or protrusions formed in a tilt direction with respect to gate line 22.

Hereinafter, a method of manufacturing a TFT array panel for a liquid crystal display according to an embodiment of the present invention will be described with reference to FIGS. 1A and 1B. First, a multi-layered metal film (not shown) for gate lines is deposited on a substrate 10 and patterned to form gate lines 22, 24, and 26 extending in a row direction, including gate line 22, gate electrode 26, and gate line terminal 24. Then, gate insulating layer 30, an amorphous silicon layer (not shown) for a semiconductor layer, and a doped amorphous silicon layer are sequentially deposited on substrate 10. An exemplary layer 30 may be made of silicon nitride. The amorphous silicon layer and the doped amorphous silicon layer are subjected to photolithography, whereby an island-shaped semiconductor layer 40 is formed on gate insulating layer 30 of gate electrode 26, light blocking sub-layers 91, 92, 93, and 94 are formed around gate electrode 26 to overlap with at least a portion of gate electrode 26, and a doped amorphous silicon layer pattern (not shown) is formed on semiconductor layer 40. A data metal layer (not shown) is deposited on the resultant structure and patterned by photolithography using a mask to form data lines 62, 65, 66, and 68, such that data line 62 intersects gate line 22; source electrode 65 connects to data line 62 and extends over gate electrode 26; data line terminal 68 connects to an end of data line 62; and drain electrode 66 is separated from source electrode 65, and opposing source electrode 65, with respect to gate electrode 26. Then, a portion of the amorphous silicon layer pattern exposed by data lines 62, 65, 66, and 68 is etched to form ohmic contact layer patterns 55 and 56, which are separated from each other with respect to gate electrode 26. At the same time, semiconductor layer 40 between ohmic contact layer patterns 55 and 56 is exposed. To stabilize the exposed surface of semiconductor layer 40, oxygen plasma treatment may be performed. Passivation layer 70 is formed by CVD growth of a silicon nitride layer, an a-Si:C:O layer, or an a-Si:O:F layer. Passivation layer 70 also may be formed by an organic insulating layer coating. Then, gate insulating layer 30 and passivation layer 70 are patterned by photolithography to form contact holes 74, 76, and 78, exposing gate line terminal 24, drain electrode 66, and data line terminal 68. Contact holes 74, 76, and 78 may be formed, for example, in a square or a circular shape. Then, an ITO or IZO layer is deposited, followed by a photolithography step to form pixel electrode 82 connected to drain electrode 66 via contact hole 76 and an auxiliary gate line terminal 86, and auxiliary data line terminal 88 connected to gate line terminal 24 and data line terminal 68 via contact holes 74 and 78, respectively. Nitrogen gas preheating may be performed prior to the deposition of the ITO or IZO layer, to prevent the formation of a metal oxide layer through contact holes 74, 76, and 78 onto the exposed surfaces of gate line terminal 24, drain electrode 66, and data line terminal 68, respectively.

Hereinafter, an operation for preventing light leakage current in a liquid crystal display according to an embodiment of the present invention will be described with reference to FIG. 1C. Referring to FIG. 1C, a color filter panel is disposed opposite to a TFT array panel. The color filter panel includes insulating substrate 110 made of transparent glass, etc., black matrix 120 formed on insulating substrate 110 to prevent light leakage, red-green-blue (RGB) color filter 130, and common electrode 140 made of a transparent conductive material such as ITO or IZO. Here, black matrix 120 may be composed of black matrix portions corresponding to gate line (see 22 of FIG. 1A), data line (see 62 of FIG. 1A), and pixel electrode 82. Black matrix 120 may be formed in various shapes to prevent light leakage that may occur at or around pixel electrode 82. To improve lateral visibility, common electrode 140 may include a plurality of cutouts or protrusions formed in a tilt direction with respect to the gate line.

The liquid crystal display according to an embodiment of the present invention shown in FIG. 1C includes a color filter panel, a TFT array panel opposing to the color filter panel, and liquid crystal layer 200 interposed therebetween. When a voltage is applied across pixel electrode 82 of the TFT array panel and common electrode 140 of the color filter panel, the liquid crystal display displays an image by adjusting the amount of light transmitted therethrough by rearranging the liquid crystal molecules of liquid crystal layer 200. In general, the light leakage current of a liquid crystal display results from light emitted from a backlight (see A1 and A2 of FIG. 1C) and light incident from the outside (see B1 of FIG. 1C). The liquid crystal display according to an embodiment of the present invention, shown in FIGS. 1A through 1C minimizes light leakage current using gate electrode 26 and light blocking sub-layers 91, 92, 93, and 94. That is, semiconductor layer 40 completely overlaps with gate electrode 26 to prevent the direct incidence of a light beam A2 emitted from a backlight into semiconductor layer 40. In this regard, it is desirable that the width Wg of gate electrode 26 is much larger than that width Wa of semiconductor layer 40. In the absence of light blocking sub-layers 91, 92, 93, and 94, after being emitted from a backlight is incident around gate electrode 26 at a predetermined incidence angle, light beam A1 may be reflected from common electrode 140 of the color filter panel and then become incident to semiconductor layer 40. However, light blocking sub-layers 91, 92, 93, and 94 according to the present invention, which overlap with gate electrode 26 along the edge of gate electrode 26, can minimize light leakage current by absorbing the light beam A1. In this regard, to efficiently prevent the light beam A1 incident onto the periphery of gate electrode 26, light blocking sub-layers 91, 92, 93, and 94 may overlap at least a portion of gate electrode 26. For example, an overlapping width Wo between each of light blocking sub-layers 91, 92, 93, and 94 and gate electrode 26 may be about 3 μm or less.

In the absence of light blocking sub-layers 91, 92, 93, and 94, external light beam B1 incident onto the periphery of black matrix 120 at a predetermined incidence angle may be sequentially reflected from gate electrode 26 and common electrode 140 and then incident onto semiconductor layer 40. However, by disposing light blocking sub-layers 91, 92, 93, and 94 to overlap with gate electrode 26 along the edge of gate electrode 26, light leakage current can be minimized via absorbing the light beam B1 prior to being reflected from gate electrode 26.

In this regard, as the width Wb of light blocking sub-layers 91, 92, 93, and 94 increases, light leakage current can be minimized. However, to avoid reducing the aperture ratio of a pixel, it is desirable to form light blocking sub-layers 91, 92, 93, and 94 to a width of about 10 μm or less. More desirably, light blocking sub-layers 91, 92, 93, and 94 may have a width of between about 4 μm to about 8 μm.

Figure 2:
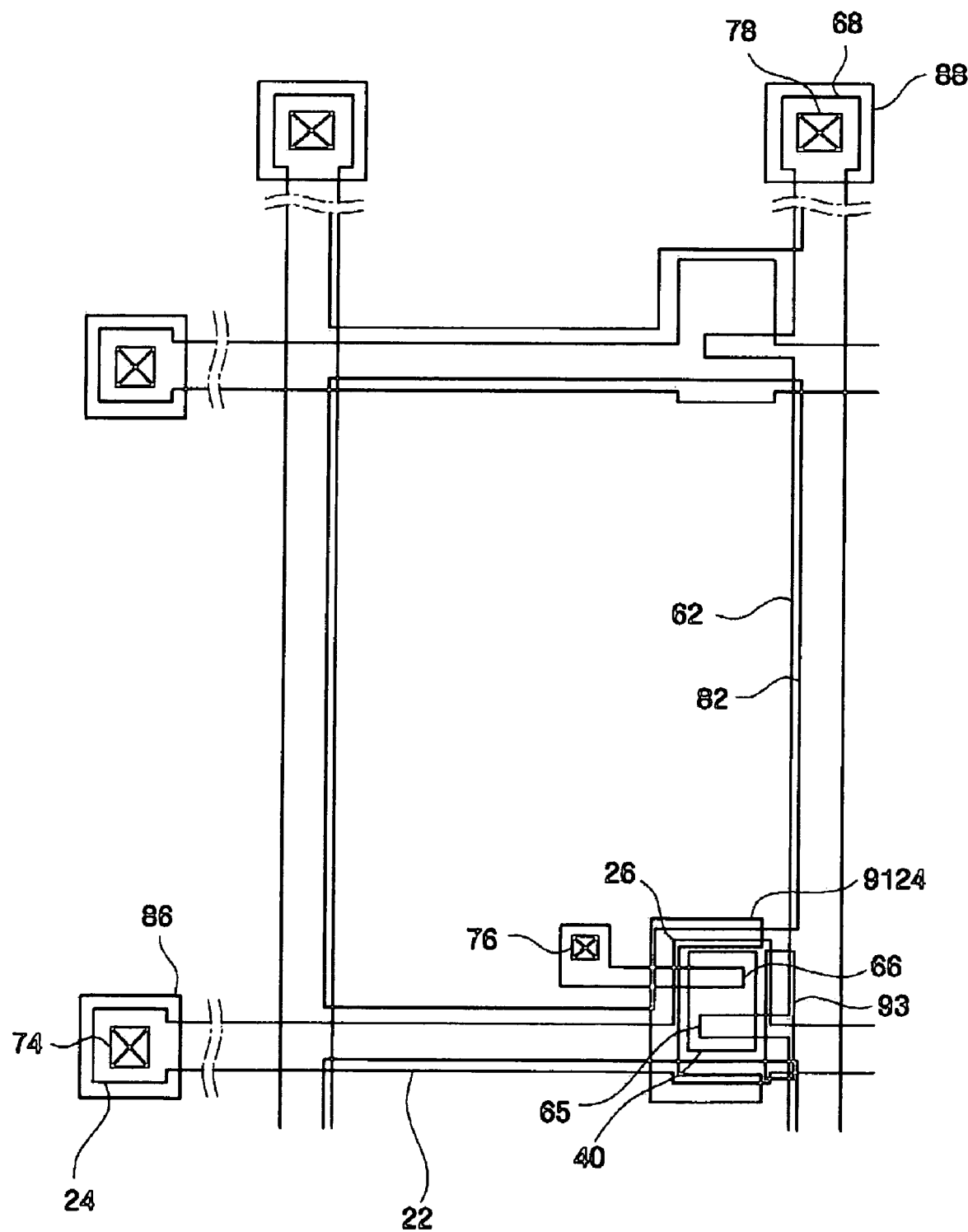
FIG. 2 is a circuit view of a TFT array panel according to another embodiment of the present invention.
Figure 3:
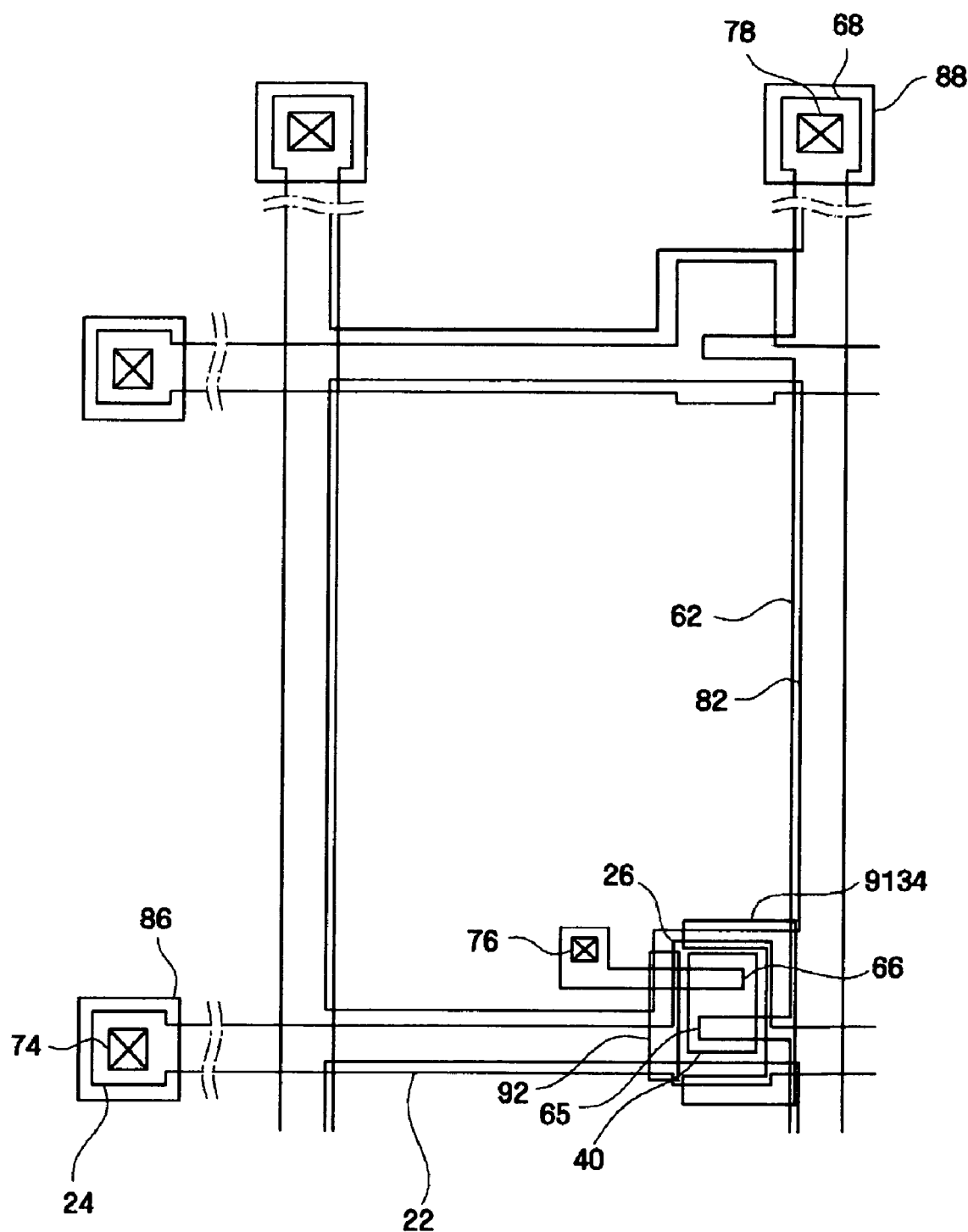
FIG. 3 is a circuit view of a TFT array panel according to still another embodiment of the present invention.
Figure 4:
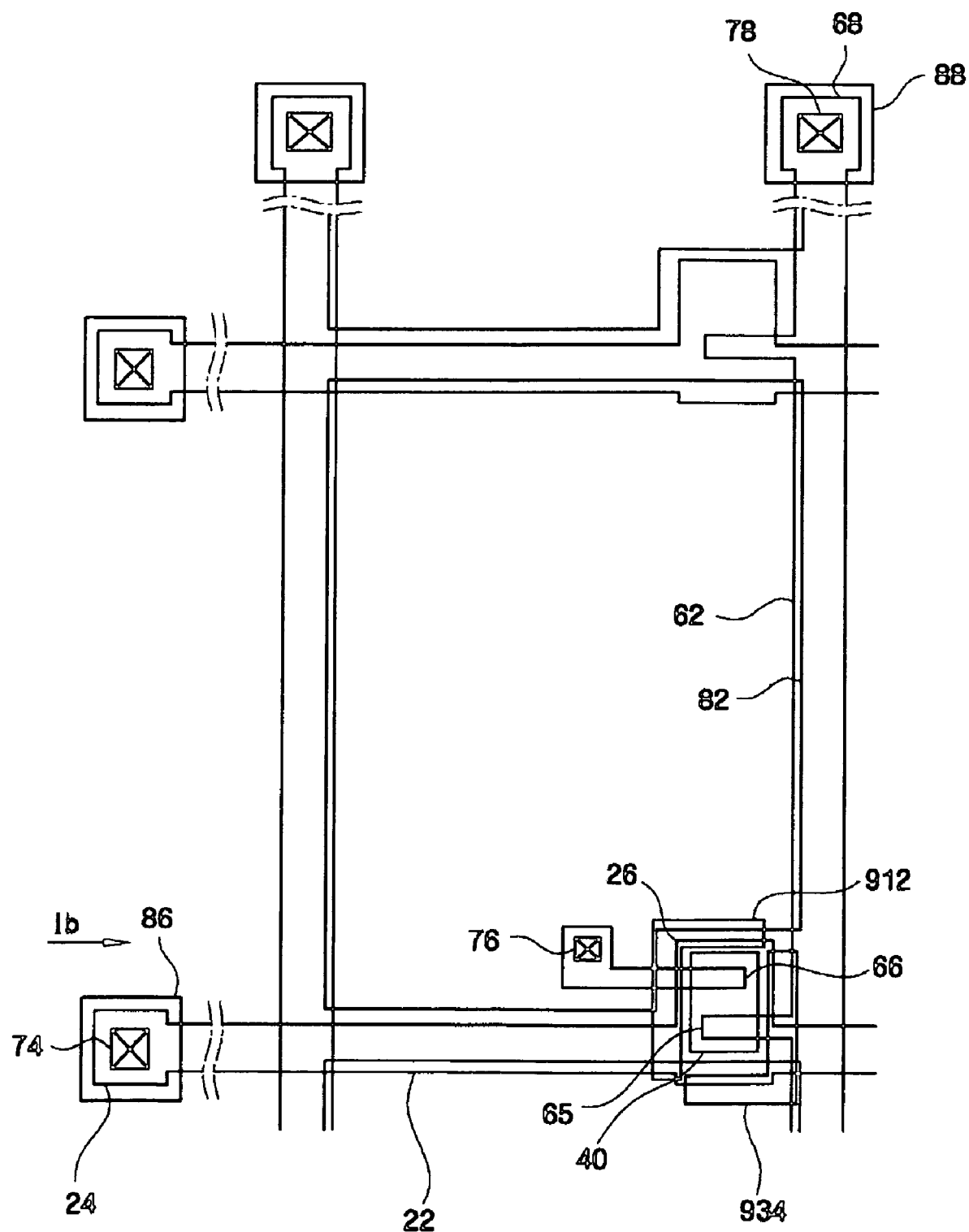
FIG. 4 is a circuit view of a TFT array panel according to yet another embodiment of the present invention.
Figure 5:
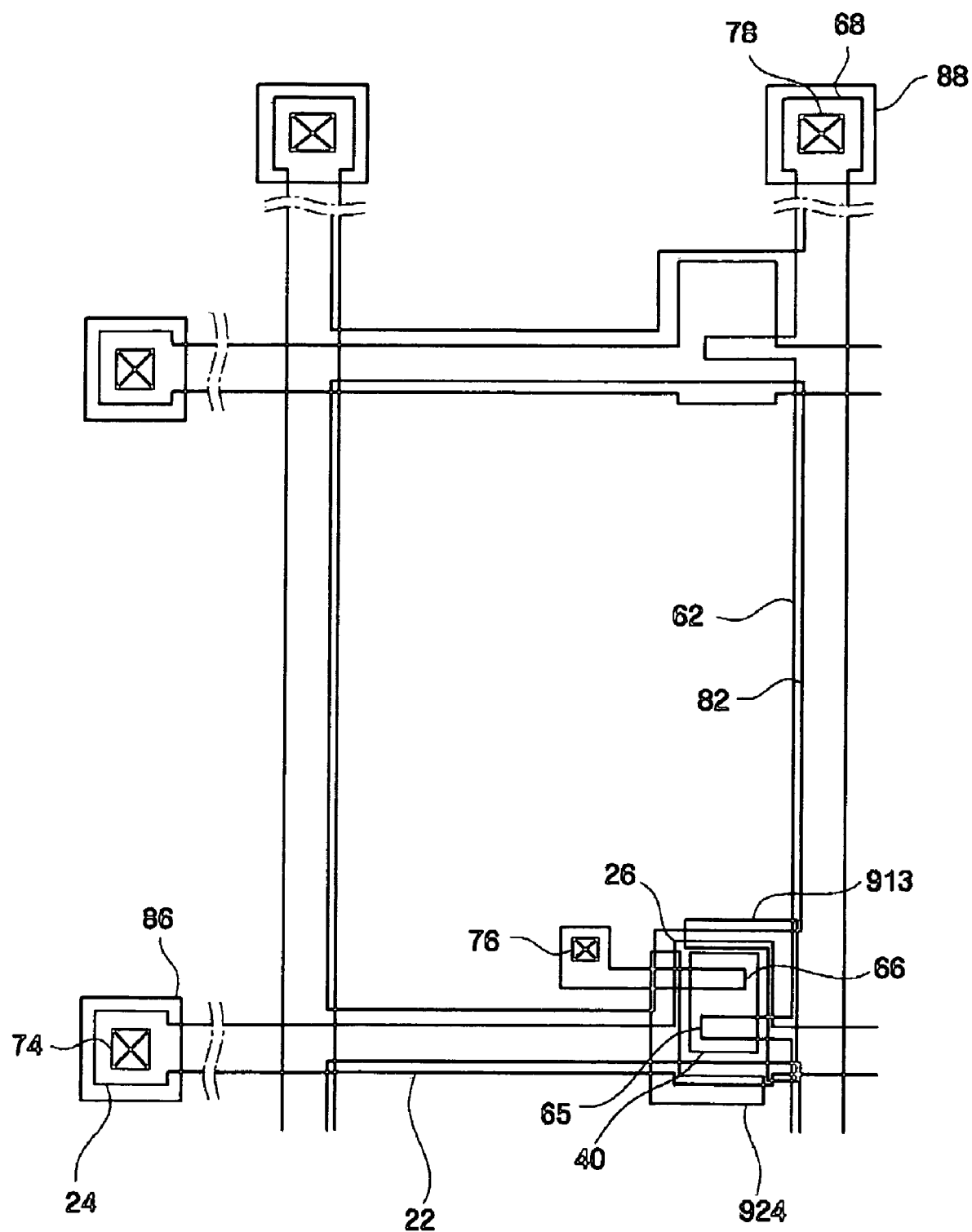
FIG. 5 is a circuit view of a TFT array panel according to a further embodiment of the present invention.

Hereinafter, TFT array panels according to embodiments of the present invention will be described with reference to FIGS. 2 through 5. For convenience of illustration, the same constitutional elements as in the embodiment shown in FIGS. 1A through 1C are represented by the same reference numerals and thus the detailed description thereof will be omitted. FIG. 2 is a circuit view of a TFT array panel according to another embodiment of the present invention. The TFT array panel shown in FIG. 2 may have substantially the same structure as that in the embodiment shown in FIGS. 1A through 1C, but also may have an alternative structure as exemplified below. Referring to FIG. 2, light blocking layer 9124 extends along the upper, left, and lower sides of a gate electrode 26, and light blocking layer 93 is disposed on the right side of gate electrode 26. FIG. 3 is a circuit view of a TFT array panel according to still another embodiment of the present invention. The TFT array panel shown in FIG. 3 may have substantially the same structure as that in the embodiment shown in FIGS. 1A through 1C, but also may have an alternative structure as exemplified below. Referring to FIG. 3, light blocking layer 9134 extends along the upper, right, and lower sides of a gate electrode 26, and light blocking layer 92 is disposed on the left side of gate electrode 26. FIG. 4 is a circuit view of a TFT array panel according to yet another embodiment of the present invention. The TFT array panel shown in FIG. 4 may have substantially the same structure as that in the embodiment shown in FIGS. 1A through 1C, but also may have an alternative structure, as exemplified below. Referring to FIG. 4, light blocking layer 912 extends along the upper and left sides of gate electrode 26, and light blocking layer 934 extends along the lower and right sides of gate electrode 26. FIG. 5 is a circuit view of a TFT array panel according to a further embodiment of the present invention. The TFT array panel shown in FIG. 5 may have substantially the same structure as that in the embodiment shown in FIGS. 1A through 1C, but also may have an alternative structure, as exemplified below. Referring to FIG. 5, light blocking layer 913 extends along the upper and right sides of gate electrode 26, and light blocking layer 924 extends along the lower and left sides of gate electrode 26. That is, the above-described light blocking sub-layers 91, 92, 93, 94, 9124, 9134, 912, 934, 913, and 924 may overlap at least a portion of gate electrode 26, and may be formed in various shapes so long as a short between a source electrode and a drain electrode does not occur.

As described above, in a TFT array panel, a liquid crystal display including the same and the manufacturing method of the TFT array panel according to the present invention, light leakage current can be effectively minimized, thereby improving a display characteristic, such as increasing a contrast ratio, or reducing image flickering.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A thin film transistor (TFT) array panel comprising:
a transistor structure having a gate line and a data line intersecting the gate line, including:
a gate electrode formed on an insulating substrate from the gate line,
a gate insulating layer formed on the gate electrode and the insulating substrate,
a semiconductor layer formed directly on the gate insulating layer and overlapped with the gate electrode,
a light blocking layer formed around and overlapping at least a portion of the gate electrode and wherein the light blocking layer is formed directly on the gate insulating layer,
a source electrode formed from the data line and overlapping at least a portion of the semiconductor layer, and
a drain electrode opposing to the source electrode with respect to the gate electrode and overlapping at least a portion of the semiconductor layer, and
a pixel electrode formed on and insulated from the transistor structure and electrically connected to the drain electrode,
wherein the light blocking layer is separated from the source electrode and the drain electrode.

2. The TFT array panel of claim 1, wherein the light blocking layer comprises substantially the same material as the semiconductor layer.

3. The TFT array panel of claim 1, wherein the light blocking layer comprises a light absorbing material.

4. The TFT array panel of claim 3, wherein the light blocking layer comprises amorphous silicon.

5. The TFT array panel of claim 1, wherein the light blocking layer overlaps neither the source electrode nor the drain electrode.

6. The TFT array panel of claim 1, wherein the light blocking layer overlaps one of the source electrode and the drain electrode.

7. The TFT array panel of claim 1, wherein the semiconductor layer completely overlaps with the gate electrode.

8. The TFT array panel of claim 1, wherein the light blocking layer comprises a plurality of light blocking sub-layers, wherein each of the light blocking sub-layers is separated from the other light blocking sub-layers.

9. The TFT array panel of claim 1, wherein an overlapping width between the gate electrode and the light blocking layer is about 3 μm or less.

10. The TFT array panel of claim 1, wherein the light blocking layer has a width of about 10 μm or less.

11. A liquid crystal display comprising:
a TFT array panel comprising a transistor structure and a pixel electrode, the transistor structure having a gate electrode formed on an insulating substrate,
a gate insulating layer formed on the gate electrode and the insulating substrate,
a semiconductor layer formed directly on the gate insulating layer and overlapped with the gate electrode, the semiconductor layer completely overlapping the gate electrode,
a light blocking layer formed on the same layer as the semiconductor layer and overlapping at least a portion of the gate electrode, wherein the light blocking layer is formed directly on the gate insulating layer,
a source electrode overlapping at least a portion of the semiconductor layer, a drain electrode opposing to the source electrode with respect to the gate electrode and overlapping at least a portion of the semiconductor layer,
and the pixel electrode being formed on and insulated from the transistor structure, being electrically connected to the drain electrode; and
a color filter panel comprising a color filter and a common electrode, the color filter panel formed opposite to and facing the TFT array panel,
wherein the light blocking layer is separated from the source electrode and the drain electrode.

12. The LCD of claim 11, wherein the light blocking layer comprises substantially the same material as the semiconductor layer.

13. The LCD of claim 11, wherein the light blocking layer comprises a light absorbing material.

14. The LCD of claim 13, wherein the light blocking layer comprises amorphous silicon.

15. The LCD of claim 11, wherein the light blocking layer overlaps neither the source electrode nor the drain electrode.

16. The LCD of claim 11, wherein the light blocking layer overlaps one of the source electrode and the drain electrode.

17. The LCD of claim 11, wherein the light blocking layer comprises a plurality of light blocking sub-layers, wherein each of the light blocking sub-layers is separated from the other light-blocking sub-layers.

18. The LCD of claim 11, wherein an overlapping width between the gate electrode and the light blocking layer is about 3 μm or less.

19. The LCD of claim 11, wherein the light blocking layer has a width of about 10 μm or less.

20. A method of manufacturing a thin film transistor (TFT) array panel comprising:
forming a gate line on an insulating substrate, wherein the gate line comprises a gate electrode;
forming a gate insulating layer on the gate electrode and the insulating substrate,
forming a semiconductor layer directly on the gate insulating layer and overlapped with and the gate electrode;
forming a light blocking layer directly on the gate insulating layer and around the gate electrode, wherein the light blocking layer overlaps at least a portion of the gate electrode;
forming a data line intersecting the gate line, wherein the data line comprises a source electrode, and wherein the source electrode is formed to overlap at least a portion of the semiconductor layer;
forming a drain electrode opposing to the source electrode with respect to the gate electrode, wherein the drain electrode is formed to overlap at least a portion of the semiconductor layer, wherein a transistor structure is formed from the gate electrode, the semiconductor layer, the light blocking layer, the source electrode and the drain electrode; and
forming a pixel electrode on and insulated from the transistor structure, wherein the pixel electrode is electrically connected to the drain electrode,
wherein the light blocking layer is separated from the source electrode and the drain electrode.

21. The method of claim 20, wherein the light blocking layer comprises substantially the same material as the semiconductor layer.

22. The method of claim 20, wherein the light blocking layer comprises a light absorbing material.

23. The method of claim 22, wherein the light blocking layer comprises amorphous silicon.

24. The method of claim 20, wherein the light blocking layer overlaps neither the source electrode nor the drain electrode.

25. The method of claim 20, wherein the light blocking layer overlaps one of the source electrode and the drain electrode.

26. The method of claim 20, wherein the semiconductor layer completely overlaps the gate electrode.

27. The method of claim 20, wherein the light blocking layer comprises a plurality of light blocking sub-layers, wherein each of the light blocking sub-layers is separated from the other light blocking sub-layers.

28. The method of claim 20, wherein an overlapping width between the gate electrode and the light blocking layer is about 3 μm or less.

29. The method of claim 20, wherein the light blocking layer has a width of about 10 μm or less.

30. A thin film transistor (TFT) array panel comprising:
    a gate line and a data line intersecting the gate line, including
    a gate electrode formed on an insulating substrate from the gate line,
    a gate insulating layer formed on the gate electrode and the insulating substrate,
    a semiconductor layer formed directly on the gate insulating layer and overlapped with the gate electrode,
    a light blocking layer overlapping at least a portion of the gate electrode and wherein the light blocking layer is formed directly on the gate insulating layer,
    a source electrode formed from the data line and overlapping at least a portion of the semiconductor layer,
    a drain electrode opposing to the source electrode with respect to the gate electrode and overlapping at least a portion of the semiconductor layer, and
    a pixel electrode electrically connected to the drain electrode,
    wherein the light blocking layer is separated from the source electrode and the drain electrode.

31. The TFT array panel of claim 30, wherein the light blocking layer is formed around the gate electrode.

32. The TFT array panel of claim 30, wherein the light blocking layer comprises substantially the same material as the semiconductor layer.

33. The TFT array panel of claim 30, wherein the light blocking layer comprises a light absorbing material.

34. The TFT array panel of claim 33, wherein the light blocking layer comprises amorphous silicon.

35. The TFT array panel of claim 30, wherein the light blocking layer is separated from the semiconductor layer.

36. The TFT array panel of claim 30, wherein the light blocking layer overlaps at least one of the source electrode and the drain electrode.

37. The TFT array panel of claim 30, wherein the semiconductor layer completely overlaps with the gate electrode.

38. The TFT array panel of claim 30, wherein the light blocking layer comprises a plurality of light blocking sub-layers, wherein each of the light blocking sub-layers is separated from the other light blocking sub-layers.

39. The TFT array panel of claim 30, wherein an overlapping width between the gate electrode and the light blocking layer is about 3 μm or less.

40. The TFT array panel of claim 30, wherein the light blocking layer has a width of about 10 μm or less.

41. A liquid crystal display comprising:
    a TFT array panel comprising a transistor and a pixel electrode, the transistor having a gate electrode formed on an insulating substrate,
    a gate insulating layer formed on the gate electrode and the insulating substrate,
    a semiconductor layer formed directly on the gate insulating layer and overlapped with the gate electrode, the semiconductor layer completely overlapping the gate electrode,
    a light blocking layer formed on the same layer as the semiconductor layer and overlapping at least a portion of the gate electrode, wherein the light blocking layer is formed directly on the gate insulating layer,
    a source electrode overlapping at least a portion of the semiconductor layer, a drain electrode opposing to the source electrode with respect to the gate electrode and overlapping at least a portion of the semiconductor layer,
    and
    the pixel electrode being electrically connected to the drain electrode; and
    a color filter panel comprising a color filter and a common electrode, the color filter panel formed opposite to and facing the TFT array panel,
    wherein the light blocking layer is separated from the source electrode and the drain electrode.

42. The LCD of claim 41, wherein the light blocking layer comprises substantially the same material as the semiconductor layer.

43. The LCD of claim 41, wherein the light blocking layer comprises a light absorbing material.

44. The LCD of claim 43, wherein the light blocking layer comprises amorphous silicon.

45. The LCD of claim 41, wherein the light blocking layer overlaps neither the source electrode nor the drain electrode.

46. The LCD of claim 41, wherein the light blocking layer overlaps at least one of the source electrode and the drain electrode.

47. The LCD of claim 41, wherein the light blocking layer comprises a plurality of light blocking sub-layers, wherein each of the light blocking sub-layers is separated from the other light-blocking sub-layers.

48. The LCD of claim 41, wherein an overlapping width between the gate electrode and the light blocking layer is about 3 μm or less.

49. The LCD of claim 41, wherein the light blocking layer has a width of about 10 μm or less.

50. A method of manufacturing a thin film transistor (TFT) array panel comprising:
    forming a gate electrode on an insulating substrate;
    forming a gate insulating layer on the gate electrode and the insulating substrate,
    forming a semiconductor layer directly on the gate insulating layer, wherein the semiconductor layer overlaps the gate electrode;
    forming a light blocking layer directly on the gate insulating layer, wherein the light blocking layer overlaps at least a portion of the gate electrode;
    forming a data line intersecting the gate line, a source electrode overlapping at least a portion of the semiconductor layer;
    forming a drain electrode opposing to the source electrode with respect to the gate electrode, wherein the drain electrode is formed to overlap at least a portion of the semiconductor layer, wherein a transistor structure is formed from the gate electrode, the semiconductor layer, the light blocking layer, the source electrode and the drain electrode; and
    forming a pixel electrode electrically connected to the drain electrode,
    wherein the light blocking layer is separated from the source electrode and the drain electrode.

51. The method of claim 50, wherein the light blocking layer comprises substantially the same material as the semiconductor layer.

52. The method of claim 50, wherein the light blocking layer comprises a light absorbing material.

53. The method of claim 52, wherein the light blocking layer comprises amorphous silicon.

54. The method of claim 50, wherein the light blocking layer overlaps neither the source electrode nor the drain electrode.

55. The method of claim 50, wherein the light blocking layer overlaps at least one of the source electrode and the drain electrode.

56. The method of claim 50, wherein the semiconductor layer completely overlaps the gate electrode.

57. The method of claim 50, wherein the light blocking layer comprises a plurality of light blocking sub-layers, wherein each of the light blocking sub-layers is separated from the other light blocking sub-layers.

58. The method of claim 50, wherein an overlapping width between the gate electrode and the light blocking layer is about 3 μm or less.

59. The method of claim 50, wherein the light blocking layer has a width of about 10 μm or less.

* * * * *